United States Patent
Odier et al.

(10) Patent No.: US 8,642,511 B2
(45) Date of Patent: *Feb. 4, 2014

(54) METHOD FOR DEPOSITING OXIDE THIN FILMS ON TEXTURED AND CURVED METAL SURFACES

(75) Inventors: Philippe Odier, Claix (FR); Stéphanie Morlens, Grenoble (FR); Cyril Millon, Grenoble (FR); Sarah Petit, Villeurbanne (FR); Tristan Caroff, Montbonnot St. Martin (FR); Carmen Jimenez, Grenoble (FR); Jean-Louis Soubeyroux, Voreppe (FR); Arnaud Allais, Lyons (FR); Mark Rikel, Huerth (DE)

(73) Assignee: Centre National de la Recherche Scientifique, Paris Cedex (FR)

( * ) Notice: Subject to any disclaimer, the term of this patent is extended or adjusted under 35 U.S.C. 154(b) by 96 days.
This patent is subject to a terminal disclaimer.

(21) Appl. No.: 13/139,961

(22) PCT Filed: Dec. 18, 2009

(86) PCT No.: PCT/FR2009/001449
§ 371 (c)(1),
(2), (4) Date: Sep. 12, 2011

(87) PCT Pub. No.: WO2010/076429
PCT Pub. Date: Jul. 8, 2010

(65) Prior Publication Data
US 2012/0028810 A1    Feb. 2, 2012

(30) Foreign Application Priority Data
Dec. 18, 2008    (FR) ..................... 08 07113

(51) Int. Cl.
*H01L 39/24*    (2006.01)

(52) U.S. Cl.
USPC .......................................... 505/434

(58) Field of Classification Search
USPC ............ 505/236–237, 434, 510; 427/62
See application file for complete search history.

(56) References Cited

U.S. PATENT DOCUMENTS

| 5,217,754 A | 6/1993 | Santiago-Aviles et al. |
| 5,945,162 A | 8/1999 | Senateur et al. |

(Continued)

FOREIGN PATENT DOCUMENTS

| EP | 1 916 720 A | 4/2008 |
| EP | 2 012 373 A1 | 1/2009 |

(Continued)

OTHER PUBLICATIONS

International Search Report for International Application No. PCT/FR2009/001449, dated May 21, 2010.

(Continued)

*Primary Examiner* — Colleen Dunn
(74) *Attorney, Agent, or Firm* — McCarter & English, LLP (57) ABSTRACT

Method of depositing a layer of oxide of at least one metal element on a curved surface of a textured metal substrate, said method comprising the following steps:
(1) a layer of a precursor of at least one oxide of a metal is deposited using an organic solution of at least one precursor of said metal, this solution preferably having a viscosity, measured at the temperature of the method, of between 1 mPa s and 20 mPa s, and even more preferentially between 2 mPa s and 10 mPa s.
(2) said layer of oxide precursor is left to dry,
(3) heat treatment is carried out in order to pyrolyse said oxide precursor and to form the oxide, at least part of said heat treatment being carried out under a flow of reducing gas, said reducing gas preferably having a flow rate greater than 0.005 cm/s, preferentially between 0.012 cm/s and 0.1 cm/s, and even more preferentially between 0.04 cm/s and 0.08 cm/s.

17 Claims, 3 Drawing Sheets

(56) References Cited

U.S. PATENT DOCUMENTS

| | | | |
|---|---|---|---|
| 6,001,416 | A | 12/1999 | Moriyama et al. |
| 6,077,344 | A | 6/2000 | Shoup et al. |
| 6,086,957 | A | 7/2000 | Boyle et al. |
| 6,270,908 | B1 | 8/2001 | Williams et al. |
| 6,440,211 | B1 | 8/2002 | Beach et al. |
| 6,451,450 | B1 | 9/2002 | Goyal et al. |
| 6,537,689 | B2 | 3/2003 | Schoop et al. |
| 6,663,976 | B2 | 12/2003 | Beach et al. |
| 7,261,776 | B2 | 8/2007 | Rupich et al. |
| 2002/0134300 | A1 | 9/2002 | Beach et al. |
| 2007/0026247 | A1 | 2/2007 | Paranthaman et al. |
| 2007/0179063 | A1 | 8/2007 | Malozemoff et al. |
| 2007/0197045 | A1 | 8/2007 | Backer et al. |
| 2007/0197395 | A1 | 8/2007 | Kodenkandath et al. |
| 2008/0039330 | A1 | 2/2008 | Wolf et al. |
| 2008/0113869 | A1 | 5/2008 | Selvamanickam et al. |
| 2008/0119365 | A1 | 5/2008 | Allais et al. |

FOREIGN PATENT DOCUMENTS

| | | |
|---|---|---|
| WO | WO 93/08838 | 5/1993 |
| WO | WO 95/02711 | 1/1995 |
| WO | WO 2006/015819 A1 | 2/2006 |
| WO | WO 2007/004820 A1 | 1/2007 |
| WO | WO 2008/078852 A1 | 7/2008 |
| WO | WO 2009/044938 A2 | 4/2009 |

OTHER PUBLICATIONS

International Preliminary Report on Patentability w/English translation of Written Opinion of the International Searching Authority for International Application No. PCT/FR2009/001449, dated Jul. 5, 2011.

Yu, Z M et al., "La2r2O7 films on Cu-Ni alloy by chemical solution deposition process", Materials Science and Engineering, Jun. 15, 2006, pp. 126-131, vol. 130, No. 1-3, Lausanne, Switzerland.

Teranishi, R. et al., "Growth mechanism of Y123 film by MOD-TFA process", Oct. 1, 2002, pp. 1033-1038, North-Holland Publishing, Amsterdam, Netherlands.

Knoth, et al., "Detailed investigations on La2r2O7 buffer layers for YBCO-coated conductors prepared by chemical solution deposition", Dec. 16, 2006, pp. 517-529, Acta Materialia, Oxford, Great Britain.

He, Qing, et al., "Deposition of biaxially-oriented metal and oxide buffer-layer films on textured Ni tapes: new substrate for high-current, high-temperature superconductors", Physica C, 1997, vol. 275, pp. 155-161.

Goyal, et al., "Using RABiTS to Fabricate High-Temperature Superconducting Wire", JOM, Jul. 1999, pp. 19-23.

Soubeyroux, J.L., et al., "Industrial Fe-Ni alloys for HTS coated conductor tapes", Journal of Physics, Conference Series 97, 2008.

Goyal, et al., "Recent progress in the fabrication of high-JC tapes by epitaxial deposition of YBCO on RABiTS", Physica C, 2001, vol. 357-360, pp. 903-913.

Knoth, K., et al., "Growth of thick chemical solution derived pyrochlore La2Zr2O7 buffer layers for YBa2Cu2O7-x coated conductors", Thin Solid Films, 2008, vol. 516, pp. 2099-2108.

Villaume, A. et al., "In situ strain and transport magneto-optical investigations in superconductors", Superconductor Science and Technology, 2008, vol. 21.

Caroff, et al., "La2Zr2O7 single buffer layer for YBaCuO RABiTS coated conductors", Superconductor Science and Technology, 2008, vol. 21.

Freyhardt, H.C., et al., "YBaCuO Thick Films on Planar and Curved Technical Substrates", IEEE Transactions on Applied Superconductivity, 1997, vol. 7, No. 2, pp. 1426-1431.

Cantoni, C., et al., "Rheed Studies of Epitaxial Oxide Seed-Layer Growth on RABiTS Ni(001): The Role of Surface Structure and Chemistry", .http://arxiv.org/abs/cond-mat/0106254v1, submitted Jun. 13, 2001.

Knoth, et al., "Highly textured La2Zr2O7 buffer layers for YBCO-coated conductors prepared by chemical solution deposition", Superconductor Science and Technology, 2005, vol. 18., pp. 334-339.

Donet, et al., J. Phys IV, Pr. 11, AA 319, 2001.

Foltyn, S.R., et al., "Overcoming the barrier to 1000 A/cm with superconducting coatings", Applied Physics Letters 87, 2005.

Tixador, T., et al., "Thermal-electromagnetic modeling of superconductors", Cryogenics 47, pp. 539-545, 2007.

Sickafus, K.E., et al., "Radiation-induced amorphization resistance and radiation tolerance in structurally related oxides", nature materials, Mar. 2007, vol. 6, pp. 217-223.

Hawsey, R.A., et al., "Development of Biaxially Textured $YB_aCu_3O_7$ coated conductors in the U.S.", Oak Ridge National Laboratory, Oak Ridge, Tennessee.

Odier, P., et al., "New YBCO superconducting wires obtained from narrow textured tubes", Superconductor Science and Technology, 22 125024 (5pp), Oct. 23, 2009, IOP Publishing.

Maher, E., et. al., "Multi-layer coated conductor cylinders—an alternative.approach to superconducting coil fabrication", Superconductor Science and Technology, 17, Nov. 2, 2004, pp. 1440-1445, Institute of Physics Publishing.

Guibadj, A., "Realisation de multicouches pour supraconducteurs a haute temperature critique par methode chimique", Pd.D. Thesis, Universite Joseph Fourier de Genoble et Universite Hadj Lakhdar de Batna (Algerie), Sep. 28, 2009.

METHOD FOR DEPOSITING OXIDE THIN FILMS ON TEXTURED AND CURVED METAL SURFACES

FIELD OF THE INVENTION

The present invention relates to the field of oxide layers, in particular to the deposition of thin oxide layers used in electrical, electronic, magnetic, optical or optoelectronic devices.

More particularly, the present invention concerns a chemical method for the epitaxy of thin films of oxides on round textured metal substrates with small millimetric diameter, or on corrugated substrates.

PRIOR ART

Thin layers of metal oxide, binary or mixed, have very many technical applications. By way of example, very many electrical, electronic, magnetic, optical or optoelectronic devices incorporate layers of oxide, which can fulfil various functions thereon, for example: optical-effect layer (for example transparent, with a controlled optical index, non-reflective), electrically insulating layer, electrically conductive and transparent layer, diffusion barrier, "active" layer (for example piezoelectric or superconductive).

Numerous techniques are known for depositing thin films of oxide on a solid substrate. These techniques can proceed from a gaseous phase, usually in a reactive medium, or from a liquid phase. The most widespread techniques of deposition by gaseous method are: gaseous phase epitaxy, CVD (chemical vapour deposition), techniques, which may be plasma assisted, cathodic sputtering techniques, optionally in a reactive medium.

Gaseous phase epitaxy is used for the deposition of extremely thin layers; its deposition rate is slow and in general requires a very high vacuum. On the other hand, it makes it possible to deposit a layer of oxide with an ordered atomic structure if the surface of the substrate also has an ordered atomic structure. This may have an advantage for obtaining certain physical or chemical properties that are related to this ordered structure, such as specific magnetic properties. This also has an advantage for the consecutive deposition of other layers on this thin oxide layer that would have fewer structure defects and fewer holes if the layer on which they are deposited itself has an ordered structure.

Cathodic sputtering techniques afford a fairly high deposition rate but this in general leads to layers with a fairly unordered structure. They may also lead to the formation of dust; this causes the formation of small holes (pinholes) in the thin layers deposited. Likewise, CVD techniques, plasma assisted or not, do not promote the direct formation of ordered layers although a subsequent heat treatment may improve the structure thereof. These techniques may also lead to the formation of dust and holes.

In principle, all vacuum deposition techniques and/or techniques using a gaseous phase may be adapted to afford a homogeneous deposition on curved substrates, but this complicates the technology; if the substrate is for example a tube, a rotation of the substrate associated with a translation is typically carried out during the deposition of the thin layer.

Techniques involving a liquid phase do not have recourse to vacuum or ultravacuum and may for this reason appear to be technologically simpler. For example, electrochemical techniques, such as anodisation, have been known for a long time, which allow the growth of a layer of oxide on the surface of a metal. These techniques are not applicable to all metals, and may lead to very special structures (for example in the case of aluminium).

Another deposition technique involving a liquid phase is based on the deposition of a solution of a precursor of the oxide involved on the surface of the substrate, followed by the decomposition of this precursor in order to form the oxide. This deposition method, very similar to techniques known by the process name "sol-gel", is rapid, but requires at least two steps, including a heat treatment. This approach may allow the deposition of ordered thin layers of certain types of oxide on a flat textured substrate. It is described in many patent documents, such as U.S. Pat. No. 6,077,344, U.S. Pat. No. 6,270,908, U.S. Pat. No. 6,440,211, US 2002 134300 (Lockheed Martin Energy Research Corp.), U.S. Pat. No. 6,663,976 (UT-Battelle) and WO 2007/004820 (Korea Institute of Machinery & Materials).

This method has been used in particular for depositing ordered layers of mixed lanthanum and zirconium oxide (LZO) on biaxially textured metal substrates; on these "buffer layers", it is then possible to deposit by epitaxy ceramic superconductors of the YBaCuO types (also referred to as YBCO) with an ordered structure; they prevent in particular the diffusion of atoms from the metal substrate into the superconductive layer, as explained below.

Biaxially textured metal substrates can be obtained by a specific rolling method with thorough work hardening followed by recrystallisation annealing; these generally flat-shaped substrates are known to persons skilled in the art by the acronym RABiTS ("Rolling-Assisted Biaxially Textured Substrates"). They are described for example in the article "Deposition of biaxially-oriented metal and oxide buffer-layer films on textured Ni tapes: new substrate for high-current, high-temperature superconductors" by Qing He, D. K. Christen et al (appearing the journal Physica C 275 (1997), p. 155-161), in the article "Using RABiTS to Fabricate High-Temperature Superconducting Wire" by a Goyal et al (appearing in the journal JOM (July 1999), p. 19-23), in the article "Industrial Fe—Ni alloys for HTS coated conductor tapes" by J. L. Soubeyroux et al (appearing in the Journal of Physics, Conference Series 97 (2008), 012069, and in the article "Recent progress in the fabrication of high-JC tapes by epitaxial deposition of YBCO on RABiTS" by A. Goyal et al (appearing in the journal Physica C 357-360 (2001), p, 903-913). These substrates are used for the deposition of ceramic layers of the YBaCuO or other type.

In addition, biaxially textured metal sheets made from the alloy Ni—Fe, used in particular in electrical engineering, are known.

In the field of high-temperature superconductors, it is known that it is desirable to deposit these ceramic superconductors on a substrate that is as ordered as possible, in order to minimise crystallographic defects (such as dislocations at the grain joins) and defects in crystallographic orientation between the grains of the superconductor since these YBaCuO films must have a crystallographic structure that is as close as possible to that of a monocrystal in order to avoid falling off of the critical current $J_c$. This research subject is described for example in the doctoral thesis of Mr Abdenacer Guibadj, defended on 28 Sep. 2009 before a mixed examination committee of the Joseph Fourier University of Grenoble (France) and the University of Haj Lakhdar de Batna (Algeria).

The article "Growth of thick chemical solution derived pyrochlore $La_2Zr_2O_7$ buffer layers for $YBa_2Cu_2O_{7-x}$ coated conductors" by K. Knoth et al (appearing in 2008 in the journal Thin Solid Films 516, p. 2099-2108) describes the deposition of LZO layers using solutions of Zr and La salts in propionic acid on strips of nickel containing 5 at. % of tungsten; the thickness of these layers is between 80 nm and 200 nm.

These works are limited to flat substrates. However, in many technological fields, it is necessary to deposit thin layers on curved textured metal surfaces, i.e. not flat. By way of example, for manufacturing superconducting cables, it is necessary to deposit layers of ceramic superconductor on a curved textured metal substrate; this involves the deposition of a thin intermediate layer with an ordered structure. This intermediate layer, also referred to as the buffer layer, between the metal surface of the substrate and the YBaCuO ceramic, is necessary to prevent the metal of the substrate diffusing into the YBaCuO ceramic and to prevent the metal of the substrate forming an oxide, the growth of which interferes with the crystallography of the surface. This buffer layer must be both dense and thin. It must be dense in order to constitute an effective barrier for the diffusion of the nickel. It must be thin to allow twisting without fracture when the cable is formed. It must replicate as faithfully as possible the crystalline structure of the surface of the substrate (see the article "In situ strain and transport magneto-optical investigations in superconductors" by A. Villaume et al, appearing in the journal Superconductor Science and Technology 21 (2008) 034009). For example, thin layers of mixed lanthanum-zirconium oxide $La_2Zr_2O_7$ are used (see for example the U.S. Pat. No. 6,451,450 (UT-Battelle)), the patent application WO 2008/078852 (Korea Institute of Machinery & Materials), the U.S. Pat. No. 6,537,689 and U.S. Pat. No. 7,261,776 (American Superconductor Corp) and the patent application US 2008/0113869 (V. Selvamanickam). This compound can also be deposited non-stoechiometrically (see patent application US 2008/0039330 (Wolf et al)). It is also possible to use oxides of other rare earths (samarium, gadolinium, dysprosium, erbium and ytterbium), to which yttrium and scandium can be added, or several layers with different compositions (for example $La_2Zr_2O_7/CeO_2$, see US 2007/01977045 (Trithor GmbH) and US 2007/0026247 (UT-Batelle, LLC).

The publication entitled "$La_2Zr_2O_7$ single buffer layer for YBaCuO RABiTS coated conductors" (Caroff et al, Supercond. Sci. Technol. 21 (2008) 075007) describes the preparation by MOD of buffer layers of $La_2Zr_2O_7$ (LZO) of high quality on metal substrates (Ni-5 at. % W alloys) bitextured by the RABiTS process and the subsequent deposition of YBaCuO layers (450 to 800 nm thick) by pulsed injection MOCVD, leading to a simple and inexpensive architecture $NiW_{RABiTS}/LZO_{MOD}/YBaCo_{MOCVD}$. In this novel combination of the MOD and MOCVD methods, a single $LZO_{MOD}$ buffer layer is sufficient to ensure structural compatibility between YBaCuO and NiW, and to protect the substrate from oxidation during the MOCVD deposition of YBaCuO. The YBaCuO films grow epitaxially on the LZO and have critical current densities $J_c$ close to 1 MA·cm$^{-2}$ at 77 K with a critical temperature $T_c$ of 91 k and a $\Delta T_c < 1$ K.

The article "YBaCuO Thick Films on Planar and Curved Technical Substrates" by H. C. Freyhardt et al, appearing in 1997 in the journal IEEE Transactions on Applied Superconductivity, vol 7 n° 2, p. 1426-1431, describes the deposition by cathodic sputtering of layers of the YSZ (yttria-stabilized zirconium) type on flat and cylindrical surfaces; the surface thereof was polished mechanically or electrochemically.

The patent application EP 1 916 720 (Nexans) describes a method for manufacturing tubes made from biaxially textured metal, in which a flat strip (also referred to as a flat band) is formed around a metal core disposed in its long axis in a split tube, the two parallel edges then being welded one against the other over the entire length thereof by a weld of the MIG or TIG or laser type. This tube is then stretched in order to reduce its diameter until the core is in contact with the entire internal wall of the tube. Next a layer of YBaCuO is deposited to a thickness of between 1 μm and 5 μm from a gaseous or liquid phase followed by heat treatment. A layer with a thickness of 100 nm to 200 nm of cerium oxide or lanthanum-zirconium oxide can be deposited before the deposition of YBaCuO, using the same techniques as those employed for the deposition of YBaCuO. However, this document contains no concrete example for the manufacture of such a product, and does not mention the performances of such devices.

The patent application US 2008/0119365 of Arnaud Allais and Nat Dirk describes a method of manufacturing a superconducting electrical conductor with a circular cross section. The method consists of providing a metal support such as a wire, cord or tube with a diameter of between 0.5 and 3 mm, preferably made from steel. A metal layer is then deposited on the metal support, this layer having a thickness of between 1 and 20 nm. The deposition is carried out by PVD, CVD or CSD (chemical solution deposition). The film thus deposited is then subjected to texturing treatment so that as far as possible all the crystal grains are aligned (the method used for the texturing is not specified). A buffer layer of $La_2Zr_2O_7$ is then optionally deposited, by dipping in a propionic acid solution in which lanthanum acetylacetonate and zirconium acetylacetonate are dissolved. The liquid deposited dries and the material is subjected to heat treatment at 1000° C. (the duration of the treatment is not specified) in order to obtain an epitaxiated layer of $La_2Zr_2O_7$, on which a layer of YBaCuO is then deposited by epitaxy.

In another field, that of optical or photovoltaic devices, it would be wished to be able to deposit layers of oxide with an ordered structure on a biaxially textured curved substrate.

This analysis of the prior art shows the need to have available a method of depositing metal oxide layers on biaxially textured curved substrates.

SUBJECT MATTER OF THE INVENTION

A first subject matter of the invention is a method of depositing a layer of oxide of at least one metal element on a curved surface of a textured metal substrate,
    said metal substrate advantageously being a long substrate with a substantially circular or elliptical cross section, and even more advantageously a tubular substrate, or a grooved, corrugated or ribbed sheet,
    and said substrate being biaxially textured, and advantageously having a cubic texture having grains the direction [001] of which is perpendicular to the long direction of a substrate, and the direction [100] of which is parallel to the long direction of the substrate,
    said method comprising the following steps:
    (1) a layer of a precursor of at least one oxide of a metal element is deposited using an organic solution of at least one precursor, such as carboxylates (and preferentially propionates), of said metal, this solution preferably having a viscosity, measured at the temperature of the method, of between 1 mPa s and 20 mPa s, and even more preferentially between 2 mPa s and 10 mPa s.
    (2) said layer of oxide precursor is left to dry, preferably at a temperature of between 60° and 150° C., preferably between 80° C. and 100° C.,
    (3) heat treatment is carried out in order to pyrolyse said oxide precursor and to form the oxide, at least part of said heat treatment being carried out under a flow of reducing gas, preferably Ar+5% (vol) H$_2$, said reducing gas preferably having a flow rate greater than 0.005 cm/s, preferentially between 0.012 cm/s and 0.1 cm/s, and even more preferentially between 0.04 cm/s and 0.08 cm/s.

The surface can be functionalised before the deposition of the precursor layer by liquid method, advantageously by a gaseous phase treatment with an agent comprising sulphur.

The thickness of the layer deposited at step (1) depends on the extraction rate of the substrate, the viscosity of the solution and the liquid-vapour surface tension.

The substrate advantageously has a cubic texture having grains the direction [001] of which is perpendicular to the long direction of the substrate, and the direction [100] of which is parallel to the long direction of the substrate, said long direction typically being the rolling, extrusion or drawing direction, where applicable.

Advantageously, the heat treatment (step (3)) comprises a so-called pyrolysis phase and a so-called crystallisation phase. The pyrolysis phase involves a heat treatment between 150° C. and approximately 450° C., and preferably not exceeding 350° C., which can be carried out at least partly under reduced pressure. The duration of the pyrolysis phase is typically between 30 minutes and 180 minutes, preferentially between 60 minutes and 150 minutes, and even more preferentially between 60 minutes and 120 minutes.

The crystallisation phase involves a heat treatment at a temperature T of between approximately 450° C. and approximately 1100° C., preferentially between 800° C. and 1100° C. and preferentially between 850° C. and 1000° C., in order to form the oxide. The crystallisation phase is carried out under reducing-gas flow, as indicated above.

Advantageously, the heat treatment comprises a temperature rise rate of between 100° C./h and 2000° C./h, preferentially between 250° C./h and 2000° C./h and even more preferentially between 500° C./h and 2000° C./h, followed by a level phase at the temperature T for a period of between 1 and 120 minutes, preferentially between 10 and 90 minutes, and even more preferentially between 20 and minutes, and followed by a cooling at a rate of between 100° C./h and 2000° C./h, preferentially between 100° C./h and 1000° C./h, and even more preferentially between 100° C./h and 500° C./h.

The pyrolysis phase is carried out at least partially at reduced pressure.

Said oxide is an oxide that crystallises in a cubic, tetragonal or orthorhombic structure. Moreover, (a) when the oxide has a cubic structure, the mismatch (e) between the lattice constant of the substrate ($a_s$) and the lattice constant of the oxide ($a_{ox}$), and calculated according to the formula $e=|(a_{ox}-a_s)/a_s|$ and expressed as a percentage, does not exceed 15%, and advantageously does not exceed 10%, and even more advantageously does not exceed 5%, said parameter $a_{ox}$ being taken with respect to the cubic lattice constant a of the oxide, or with respect to the multiples thereof $\sqrt{(2a)}$, 2a, or $2a\sqrt{(2a)}$; (b) when the oxide has a tetragonal or orthorhombic structure, two of the three lattice constants must comply with the requirement indicated under (a).

Said oxide may be an oxide of the type $A_{2-x}B_{2+x}O_7$ where A represents one or more metal elements of valency 3 (such as La or a lanthanide, such as Gd, Dy, Lu, Nd, Sa or Sc; La being preferred), and B represents one or more metal elements of valency 4 (such as Zr, Ti, Sn, Hf, Pb, Ce, Ta; Zr being preferred), and x is a number lying between −0.1 and +0.1.

Said oxide may be selected from the group formed by: YSZ (yttrium-stabilised zirconium oxide), $Gd_2Zr_2O_7$. $Sm_2Zr_2O_7$, $Y_2O_3$, $LaAlO_3$, $La_2Zr_2O_7$ (also referred to as LZO, in which possibly part of the La is substituted by Gd), $Gd_2O_3$, $CeO_2$, $Sm_2O_3$, $La_{0.7}Sr_{0.3}MnO_3$ (also referred to as LSMO), $SrTiO_3$, $La_2Mo_2O_9$ (also known as LMO) $BaTiO_3$ and $LaMnO_3$.

In a variant of the method according to the invention, a plurality of layers of oxide are deposited on one another, these layers having identical or different chemical compositions.

The method according to the invention may also comprise a step of depositing silicon on top of the layer of oxide after the end of the crystallisation phase.

The method according to the invention can also comprise a step of depositing a superconducting oxide of the "REBaCuO" or "YBaCuO" type on top of the layer of oxide, these expressions "REBaCuO" or "YBaCuO" not implying stoechiometry between the named elements, and RE signifying one or more rare-earth elements.

DESCRIPTION OF THE FIGURES

FIGS. 1 to 5 relate to the present invention.

The following references are used in this figure: 1—external space; 2—internal space; 3—perforated wall; 4—suction direction; 5—gas inlet direction; 6—product to be treated.

The arrows indicate a direction of flow of gas.

DESCRIPTION OF THE INVENTION

The present invention concerns a method of manufacturing a layer of oxide of at least one metal element on a substrate having at least one curved surface, by a method of depositing a precursor in liquid phase, followed by the decomposition of said precursor, typically thermally, and a crystallisation heat treatment of the layer of oxide.

In an advantageous embodiment of the invention, the method comprises, in the order indicated, the following steps:

(i) a metal substrate having at least one curved surface is provided, said substrate typically being a long substrate with a substantially circular or elliptical cross section, and advantageously a tubular substrate, or a grooved, corrugated or ribbed sheet, and said substrate being biaxially textured, and advantageously has a cubic texture having grains the direction [001] of which is perpendicular to the long direction of the substrate, and the direction [100] of which is parallel to the long direction of the substrate, said long direction typically being the rolling, extrusion or drawing direction;

(ii) optionally, a functionalisation treatment is carried out on at least part of the surface of said metal substrate, preferably by treatment with H$_2$S;

(iii) an epitaxial layer of oxide of at least one metal element is deposited on at least part of the surface, this surface comprising where applicable the functionalised part of said surface, using a liquid solution;

said method being characterised in that:
at step (iii),
(a) first of all a layer of a precursor of an oxide of at least one metal element is deposited, preferably using a solution of the carboxylates (preferably propionates) of said metals A and B, this solution preferably having a viscosity, measured at the temperature of the method, of between 1 mPa s and 20 mPa s, and even more preferentially between 2 mPa s and 10 mPa s;
(b) said layer of precursor is left to dry, preferably at a temperature of between 60° C. and 150° C., and preferably between 80° C. and 100° C.,
(c) a heat treatment is carried out at a temperature T of between 800° C. and 1100° C., and preferentially between 850° C. and 1000° C., in order to form the oxide, this heat treatment being carried out:
- with a temperature rise rate of between 100° C./h and 2000° C./h, preferentially between 250° C./h and 2000° C./h and even more preferentially between 500° C./h and 2000° C./h, followed by a level phase at the temperature T for a period of between 1 and 120 minutes, preferentially between 10 and 90 minutes, and even more preferentially between 20 and 60 minutes, and followed by a cooling at a rate of between 100° C./h and 2000° C./h, preferentially between 100° C./h and 1000° C./h, and even more preferentially between 100° C./h and 500° C./h;
- under flow of reducing gas, preferably Ar+5% (vol)$H_2$, said reducing gas preferably having a flow rate greater than 0.005 cm/s, preferentially between 0.012 cm/s and 0.1 cm/s, and even more preferentially between 0.04 cm/s and 0.08 cm/s.

This so called "crystallisation" heat treatment is advantageously preceded by a so-called "pyrolysis" heat treatment during which the oxide precursor is converted into oxide.

According to the invention, at step (ii):
advantageously a functionalisation treatment of the metal substrate is carried out by a method comprising the steps of:
- treatment under vacuum (a vacuum of approximately $10^{-3}$ bar is suitable) with a temperature rise rate of 800° C./h, with a level phase at 600° C. for a period of at least one minute and preferably between 10 and 60 minutes (advantageously for approximately 30 minutes), followed by cooling to ambient temperature,
- functionalisation treatment, preferably by inert gas flow (Ar) with 0.1% (vol) $H_2S$ at ambient temperature and at a pressure of between $10^{-3}$ bar and 10 bar, preferentially at atmospheric pressure, for a period of at least 1 minute, and advantageously approximately 30 minutes,
- treatment under inert gas flow Ar+5% (vol) $H_2$ with a temperature rise rate of 800° C./h, with a level phase at 850° C. for 30 minutes, followed by cooling to ambient temperature.

We describe here in detail each of the steps.

(i) Providing a Metal Substrate

The method according to the invention can apply to biaxially textured metal substrates. As indicated above, it may for example be a case of substrates with a substantially circular or elliptical transverse section and in particular tubes, or corrugated or ribbed substrates, or any other form having a curved surface. These substrates must be made from a metal that crystallises in a structure of the FCC (face-centred cubic) type and must have a cubic texture {100}<100>. They may for example be made from nickel, or any other alloy with an FCC structure and with a similar lattice constant: nickel-iron, nickel-tungsten, nickel-copper.

Figure 5:
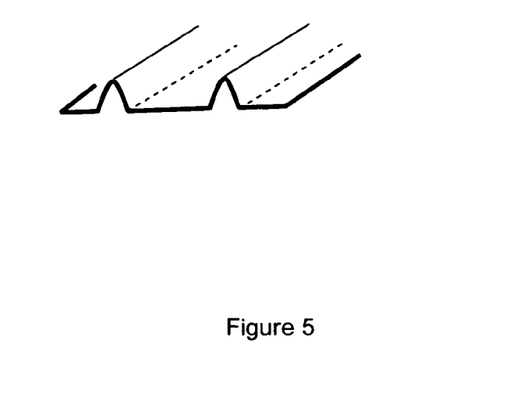
FIG. 5 shows the form of a curved substrate, biaxially textured. This substrate has a "crinkled" or "ribbed" form.

Such sheets are available commercially. For example, it is possible to use biaxially textured sheets in an Ni—W alloy, marketed for example by the company Imphy-ArcelorMittal Stainless & Nickel Alloys. They can be shaped easily, for example in order to give tubular, grooved, corrugated or ribbed forms; FIG. 5 shows an example of a ribbed sheet that can be used as a substrate in the context of the present invention.

In a particular embodiment, tubular substrates that are suitable for implementing the invention are fabricated by a method of welding the edges in which a flat strip (also referred to as a flat band) is formed around a metal core arranged in its long axis as a split tube, the two parallel edges then being welded one against the other over their entire length by a weld of the MIG or TIG type. Laser welding is also possible; it gives rise to no risk of contamination if it proceeds without the addition of metal. This tube is then drawn in order to reduce its diameter until the core is in contact with the entire internal wall of the tube. Other methods may be suitable for obtaining these textured substrates with a substantially circular or elliptical cross section.

On these biaxially textured metal substrates, there are carried out successively treatments of functionalisation of the metal substrate, chemical deposition of a precursor of the buffer layer and heat treatment, with a view to obtaining a layer consisting of a film of oxide, as dense as possible and hypertextured. For this purpose epitaxial growth on the grains of the substrate is used. The starting point is a wetting metal-organic precursor that makes it possible to perform the deposition, which is dried and then heat treated in order to synthesise the oxide.

Prior to the functionalisation of the substrate with a view to the depositing of the oxide layer, the metal substrate must be degreased. Advantageously, this is done in two steps: first of all by means of acetone (preferably in a bath subjected to ultrasound) and then by means of an alcohol, such as methanol, ethanol, butanols, or hexanols (methanol being preferred since evaporation thereof leaves no trace).

(ii) Functionalisation of the Substrate

In some cases, it is advantageous to functionalise the substrate prior to the deposition of the metal-organic precursor of the oxide layer. Functionalisation of the metal substrate has two objectives: a first objective is to provide an adaptation layer enabling the oxide to be bonded to the metal: it is a case of creating crystallographic sites on the metal able to bond to those of the oxide. In this way a layer is obtained that reproduces the atomic structure of the substrate (i.e. epitaxy).

Another purpose of functionalisation is to create a chemically stable surface since this surface will necessarily be exposed to ambient pressure when the substrate is dipped in a solution to deposit the precursor layer.

In some cases this step is essential to allow chemical bonding of the atoms of the oxide to those of the metal. This is a case in particular when it is wished to create a layer of oxide of the LZO type that acts a buffer layer for the subsequent deposition of a ceramic of the YBaCuO type.

In practice, functionalisation of the substrate is preferably carried out by a surface treatment, consisting of a deposition of one or more monolayers of sulphur. It is known that sulphur forms an ordered chemisorbed layer on the FCC (face-centred cubic) crystallographic-structure metals generally used as substrates. This layer of sulphur can be obtained by suitable heat treatment, and advantageously by a method comprising the steps of:
- treatment under vacuum (a primary vacuum, i.e. around $10^{-3}$ bar, suffices) with a temperature rise rate of between 600° C./h and 1000° C./h (and preferably approximately 800° C./h), followed by a level phase at a temperature of between 550° C. and 650° C. (preferably approximately 600° C.) for approximately 30 minutes, and then cooling to ambient temperature, flowing with inert gas (Ar) with approximately 0.1% (vol) $H_2S$ at ambient temperature for approximately 30 minutes, at atmospheric pressure;

treatment under reducing-gas flow, preferably Ar+5% (vol) $H_2$, with a temperature rise rate of between 600° C./h and 1000° C./h (and preferably approximately 800° C./h), optionally followed by a level phase at a temperature of between 750° C. and 900° C. (preferably approximately 850° C.) for approximately 30 minutes, and then cooling to ambient temperature.

This layer can be checked by surface analysis techniques known to persons skilled in the art for this use, such as Auger or RHEED.

Sulphuration treatment by the application under ultra-vacuum of a monolayer of sulphur is suggested in the article "RHEED Studies of Epitaxial Oxide Seed-Layer Growth on RABiTS Ni(001): The Role of Surface Structure and Chemistry" by C Cantoni et al, (available on the internet server [cond-mat.supr.con], arXiv:cond-mat/0106254v1).

A method of depositing sulphur on the substrate before deposition of the YBaCuO layer at atmospheric pressure is also described in the patent applications of the company American Superconductor Corp., US 2007/0197395 (but in this document a metal or oxide buffer layer other LZO is deposited on top of this sulphur layer, before deposition of the YBaCuO layer) and US 2007/0179063.

Alternatively, it is possible to use, for the functionalisation treatment, a sulphur compound, such as an organic sulphide; however, carbon may interfere with the surface functionalisation. It is also possible to treat the surface with sulphur vapours, but this is difficult to measure out. Because of the availability and simplicity of the $H_2S$ molecule, this treatment is preferred.

It is also possible to functionalise the surface by the creation of a monolayer of oxygen, or by adsorption of a controlled quantity of water vapour.

The result of the functionalisation process is a functionalisation layer stable in air for the period necessary for transferring the substrate in the liquid phase for epitaxy.

In the case where the metal substrate contains sulphur, it is possible to use the surface that forms by segregation following certain heat treatments of the metal, which then take the place of functionalisation treatment. Since segregation takes place during cooling, it is the cooling that must be carefully controlled. In some cases, texturising annealing may thus comprise functionalisation annealing.

(iii) Deposition of the Precursor Layer and Formation of the Oxide Layer

First of all, a precursor layer is deposited by liquid method, and then heat treatment is carried out to form the oxide layer. A good-quality oxide layer firstly reproduces the texture of the substrate and secondly constitutes an effective barrier to the diffusion of the atoms of the biaxially textured metal substrate.

The oxide layer formed in the context of the present invention must have a crystallographic structure compatible with that of the biaxially textured metal substrate. This compatibility can be expressed by the mismatch e between the lattice constant of the substrate ($a_s$) and the lattice constant of the oxide ($a_{ox}$) deposited, according to the formula $e=|(a_{ox}-a_s)/a_s|$, the parameter e being expressed as a percentage. If the oxide has a cubic structure, the parameter e must not exceed 15%, and advantageously does not exceed 10%, and even more advantageously does not exceed 5%, this parameter $a_{ox}$ being taken with respect to the cubic lattice constant a of the oxide, or with respect to the multiples thereof $\sqrt{(2a)}$, 2a, or $2a\sqrt{(2a)}$. If the oxide has a tetragonal or orthorhombic structure, two of the three lattice constants must comply with this requirement.

Thus, by way of example, the following oxides can be deposited on an Ni substrate or one consisting of a binary alloy Ni—W or NiCu, Bi—Fe or another alloy with a CFC structure and a suitable lattice constant:

YSZ (yttrium-stabilised zirconium oxide), $Gd_2Zr_2O_7$, $Sm_2Zr_2O_7$, $Y_2O_3$, $LaAlO_3$, $La_2Zr_2O_7$, $Gd_2O_3$, $CeO_2$, $Sm_2O_2$, $La_{0.7}Sr_{0.3}MnO_3$ (referred to as LSMO), $SrTiO_3$, $La_2Mo_2O_9$ (referred to as LMO), $BaTiO_3$, $LaMnO_3$.

The oxide layer formed in this context of the present invention may be an oxide of the $A_{2-x}B_{2+x}O_7$ type, where A represents one or more metal elements of valency 3 (such as La or an lanthanide, such as Gd, Dy, Lu, Nd, Sa, or Sc; La being preferred) and B represents one or more metal elements of valency 4 (such as Zr, Ti, Sn, Hf, Pb, Ce, Ta; Zr being preferred) such as $La_2Zr_2O_7$, and x is a number between −0.1 and +0.1. It may for example be a mixed lanthanum and zirconium oxide of nominal composition $La_2Zr_2O_7$ (LZO); such layers have been deposited, on flat substrates, for example by Caroff et al, Sup. Sci. Technol. 2008, 21 075007. In LZO, it is also possible to at least partially replace the La atoms by Gd atoms.

It is also possible to deposit oxides with an even more complex formula, for example with three different metal elements, or non-stoechiometric oxides, but always provided that the crystallographic structure thereof is compatible with that of the biaxially textured metal substrate.

In general terms, in the context of the present invention, it is also possible to deposit on top of a first thin layer of oxide a second thin layer of oxide, with an identical or different composition. By way of example, it is possible to deposit on a first layer of LZO a second layer of GZO (gadolinium-zirconium-oxide).

These oxide layers can find numerous technical applications. By way of example, the inventors have shown that, in the devices containing a ceramic superconductor of the YBaCuO or other type, a good quality of buffer layer (and in particular a layer of LZO deposited as described below) enormously simplifies the architecture of the superconductors deposited. Thus the multilayer structure Ni5W/LZO/YBaCuO/protection(Ag) deposited on a flat substrate makes it possible to pass close on 1 Ma/cm$^{-2}$ at 77° K whereas the solutions of the prior art propose up to 10 buffer layers in order to achieve the same result. The method according to the invention makes it possible in particular to use a single type of buffer layer and because of this it is simpler than the known methods. In particular, the method according to the invention makes it possible to deposit such a layer on a curved substrate, for example on a tube, so as subsequently to obtain a layer that is superconductive at the temperature of liquid nitrogen, which does not appear to be possible with the methods according to the prior art.

In general terms, obtaining an oxide layer of good quality according to the method of the invention involves many factors.

(1) Precursor

Decomposition of the precursor must give an oxide. In the present invention, use is preferably made of carboxylates in which the cation is coordinated with oxygens. It therefore enables oxides to be formed, even under reducing conditions preventing oxidation of the substrate metal. The advantage of carboxylates is the stability thereof vis-à-vis moisture in the atmosphere. The precursor is deposited by liquid method, and in particular by dipping. Among the carboxylates, propionates are preferred. In addition, they are commercially available for many metal elements, or can be prepared fairly easily.

By way of example, in order to obtain a layer of LZO, the precursor used in the present invention is a 0.6 mol/l solution of $LaZr(prop)_7$ (La/Zr=1:1, i.e. the solution contains 0.3 mol/l of La and 0.3 mol/l of Zr) in propionic acid. $LaZr(prop)_7$ is preferably prepared by attack in propionic acid of $La(acac)_3 \times 3\ H_2O$ and $Zr(acac)_4$ (where "acac" designates acetylacetonate) separately, while lightly heating (typically at approximately 60° C.), without evaporating a significant quantity of propionic acid. The maximum concentration of $LaZr(prop)_7$ usable appears to be 0.9 mol/l.

In order to obtain other layers of the $A_{2-x}B_{2+x}O_7$ type, use is advantageously also made of carboxylates, and even more preferably propionates of A and B metals. By way of example, in order to introduce gadolinium into a composition in order to deposit a layer of GZO, use is advantageously made of gadolinium propionate.

(2) Viscosity

The viscosity $\eta$ of the solution is a very important parameter since it determines the thickness deposited after dipping.

The viscosity of metal carboxylate solutions, for example that of LZO propionate solutions ($LaZr(prop)_7$), in an acid, such as propionic acid, depends on the concentration of the solution. It is known (see for example Knoth et al, Sup. Sci. Technol. 18 (2005), p. 334-339) that the viscosity of a 0.05 mol/l solution of $LaZr(prop)_7$ in propionic acid is equal to 1.5 mPa s, 2.5 for 0.15 mol/l, and 6.5 mPa s for a concentration of 0.3 mol/l.

The thickness of precursor solution deposited after dipping d is given by the Landau-Levich equation:

$$d = a \frac{(nv)^{2/3}}{\gamma^{1/6}(\rho g)^{1/2}}$$

where $\gamma$ is the liquid-vapour surface tension, $\rho$ the density of the liquid and $v$ the speed of removal from the bath, and a is a numerical parameter that is equal to approximately 0.94.

Adjuvants such as plurifunctionalised compounds, selected for example from polyamines, polyamides, polyethers, amino alcohols or true polymers, such as for example polymethyl methacrylate (PMMA), polyethylene glycol (PEG) or polyvinyl alcohol (PVA), can be added to the propionate solution in order to thicken the solution and increase the thickness deposited.

Moreover, the thickness of the deposit of precursor also depends on the temperature of the bath. Raising the temperature by a few degrees may modify the final thickness of oxide obtained after heat treatment by several tens of %. It is preferred not to exceed 40° C., and even more preferentially not to exceed 30° C. Above 40° C., the composition of the solution changes due to the evaporation of solvent (typically propionic acid if propionates are used). An excessively low temperature of the bath is liable to lead to an onset of crystallisation of one of the species present in the bath. Consequently a temperature of between 20° C. and 30° C. is preferred. The viscosity of the precursor solution at the temperature of the method is preferentially between 1 mPa s and 20 mPa s, and even more preferentially between 2 mPa s and 10 mPa s. This measurement is carried out in a conventional manner by means of a ball viscometer.

The method according to the invention involves a substrate with a curved surface, for example cylindrical in shape, such as a tube. Deposition takes place by dipping. When the substrate is removed from the liquid, the latter drains off but a film remains deposited, the thickness of which is governed by the law written above. The cylindrical geometry of the substrate modifies the flows with respect to plane geometry, in particular because of edge effects that are different.

(3) Drying

Drying makes it possible to obtain a solid layer that has the appearance of a polymeric resin. It makes it possible to handle the object easily. To obtain this layer, the layer of precursor deposited by liquid method is dried, preferably at a temperature of between 60° C. and 150° C., and preferably between 80° C. and 100° C., advantageously by infrared heating. This drying leads to the at least partial polymerisation of the layer, attested to by the fact that the precursor becomes rigid and only partially soluble in the usual solvents. This layer can also be dried by a flow of hot neutral gas (argon or nitrogen for example), preferably at a temperature of between 80° C. and 100° C.

The dipping and drying/polymerisation steps are carried out in a controlled atmosphere. This involves firstly protection against dust that would make "flaws" in the film. This also involves careful control of the humidity level, so that the method is reproducible. A relative humidity level of 20% is suitable. A lower level may also be suitable.

(4) Thickness Deposited

The thickness will be chosen according to the application sought. It depends on the extraction rate, the viscosity and the liquid-vapour surface tension. For layers of LZO and similar intended for ceramic superconductors of the YBaCuO type, the optimum thickness range of LZO, having regard to the properties of the superconductor that subsequently covers it, is situated between 30 nm and 250 nm. The inventors were able to deposit on curved surfaces, and in particular on tubes with a diameter of a few millimeters, up to 250 nm of LZO, in several successive deposits, without cracks and with correct texture qualities, although these layers are not always crystallized on the surface as required. Provided that there are correct texture and crystallization qualities, it is preferable to have a buffer layer not only the density of which but also the thickness of which is high, within the limits indicated above. This is because the inventors have found that the properties of the REBaCuO or YBaCuO superconductive layer are better for the highest thicknesses of LZO. One explanation could be that the surface defects of the substrate are more masked with thick buffer layers. A thickness of between nm and 250 nm is preferred, and even more preferentially between 80 nm and 250 nm. This is because the method according to the invention makes it possible to deposit a thickness of between 30 nm and approximately 120 nm in one go, without the formation of cracks. A typical thickness deposited in one go is 80 nm. Depositing several layers one on the other, these layers having identical compositions, gives a better densification of the buffer layer obtained. The layer deposited in a single deposition or in several successive depositions is textured biaxially.

As indicated above, the thickness of the layer deposited depends on the speed at which the substrate is extracted from the liquid. This speed is advantageously situated between 1 mm/minute and 100 mm/minute, and is preferably at least 10 mm/minute.

In general terms, the method according to the invention differs from methods on a flat substrate through the texture of the substrate. In flat strips, the texture is three-dimensional and has two preferential orthogonal directions. This means that the grains are oriented with respect to one another in the plane and perpendicular to the plane. If this strip is rolled in order to make a tube from it, radial disorientations between grains will be introduced mechanically and surface stresses created. The mean radial disorientation between grains can be calculated if the number of grains over 360° is known. A substrate in the form of a tube, as used in the context of the present invention, typically has a mean grain size of 50 µm, observed over a zone with a diameter of 2 mm, which leads to a mean radial disorientation between grains of approximately 3°; this is acceptable. Such a substrate has a bidirectional texture with a radial axis and an axial axis. Its oxide layer typically has a grain size of between 50 nm and 80 nm.

(5) Heat Treatment

This step is particularly critical for the method according to the invention. After drying the residual solvents can be evaporated under primary vacuum, and the oxide precursor is converted into oxide, typically by pyrolysis. Next a crystallisation treatment is carried out: the film is raised to a temperature of between 850° C. and 1100° C. with a temperature rise rate of between 100° C. and 2000° C./h under flow of reducing gas, preferably a mixture of argon containing 5 vol-% $H_2$. The use of such a gas prevents oxidation of the substrate. It may be useful to implement a level phase at high temperature.

The gas flow and flow rate, the temperature rise rate and the treatment temperature (maximum temperature) are essential parameters of the phase of the heat treatment. The gas speed must be as high as possible, without risking cooling the sample, and influences how the pyrolysis of the precursors takes place, in particular the advancement of the pyrolysis front, and the advancement of the crystallisation front of the textured part in the film.

The heat treatment temperature is advantageously between 800° C. and 1100° C. in order to form the oxide. It must be sufficiently high, typically above 850° C., in order to initiate crystallisation, and must be less than the crystallisation temperature of the substrate otherwise it will lose its texture. The optimum temperature depends on the substrate and the oxide. For Ni-5 at. % W, the recrystallisation temperature is advantageously situated around 1100° C. An excessively high temperature, and an excessively long treatment at high temperature, may promote interdiffusion between the metal substrate and the buffer layer. In particular, the tungsten of the nickel-tungsten substrate may diffuse in the buffer layer, and the lanthanum of the buffer layer may diffuse in the metal substrate. There may also be reactions at the interface. The optimum crystallisation temperature depends slightly on the metal element composition of the layer. The values given above are optimum for LZO. A doping with Gd may prompt this temperature to be reduced slightly.

In any event, the heat treatment advantageously takes place with a temperature rise rate of between 100° C./h and 2000° C./h, preferentially between 250° C./h and 2000° C./h and even more preferentially between 500° C./h and 2000° C./h, followed by a level phase at the temperature T for a period of between 1 and 120 minutes, preferentially between 10 and 90 minutes, and even more preferentially between 20 and 60 minutes, and followed by cooling at a rate of between 100° C./h and 2000° C./h, preferentially between 100° C./h and 1000° C./h and even more preferentially between 100° C./h and 500° C./h.

In a particular embodiment, the heat treatment can be carried out in two parts or phases distinguished by their temperature range: a first part or so-called pyrolysis phase, ranging from approximately 150° C. to approximately 450° C., and preferably not exceeding 350° C., and a second so-called crystallisation part or phase, ranging from approximately 450° C. to approximately 1000° C. or 1100° C. The temperature rise rates within these two ranges may be different, for example slow in pyrolysis phase and fast in crystallisation phase.

Advantageously, the heat treatment involves passage under vacuum in the pyrolysis domain, preferably for a period of between 30 minutes and 180 minutes, and more preferentially between 60 minutes and 120 minutes. At the end of the pyrolysis phase, it can be left to cool to ambient temperature, or the heat treatment can be continued by increasing the temperature in order to arrive in the crystallisation phase.

Moreover, the heat treatment during the crystallisation phase must take place under a flow of reducing gas, preferably Ar+5% (vol) $H_2$, said reducing gas preferably having a flow rate greater than 0.005 cm/s, preferentially between 0.012 cm/s and 0.1 cm/s, and even more preferentially between 0.04 cm/s and 0.08 cm/s. It is also possible to use a mixture of $N_2+H_2$ (typically 5% vol. $H_2$) which is less expensive than an Ar+$H_2$ mixture.

Figure 4:
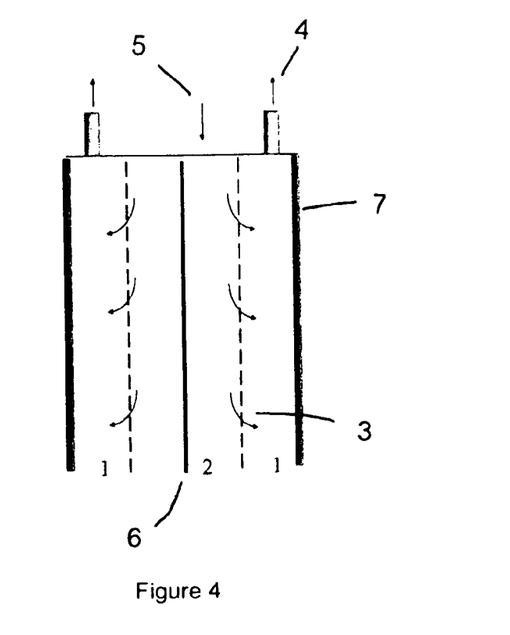
FIG. 4 shows a differential-suction tube used for heat treatment of the layer deposited according to one embodiment of the invention.

In an advantageous embodiment of the invention, this gas flow is obtained by injecting the preheated gas in counter-flow in a so-called differential aspiration tube, which is shown schematically in FIG. 4. It comprises a heated wall (7) and perforated internal walls (3) that delimit an internal space (2) and an external space (1). The product to be treated (6) is situated in the internal space (2). The gas enters (4) the tube, entrains the gaseous products from the pyrolysis reaction and is extracted outside the tube by suction (4) through the perforated walls (3). The pressure in the internal space (2) is greater than that in the external space (1).

The gas flow can also be applied during the pyrolysis phase, if it is not chosen to perform the pyrolysis as indicated above under vacuum.

In a typical embodiment, the pyrolysis phase is carried out at 350° C. under primary vacuum for 1 hour (minimum 30 minutes) in order to eliminate the propionic acid residues, and the crystallisation phase is carried out under argon/$H_2$ flow as described above.

The decomposition of the oxide precursor may also at least partially be carried out by means other than thermal.

The growth of the epitaxiated part that starts at the interface by heterogeneous nucleation on the substrate must extend as far as the surface in order to allow resumption of epitaxy for the subsequent deposition of other layers, for example a layer of REBaCuO, YBaCuO or silicon, of good quality. However, the properties of the oxide films obtained by chemical method mean that nucleation may also occur by homogeneous-phase nucleation, the grains then germinating in random directions and creating a non-epitaxial part on the surface. It is essential to avoid this homogenous-phase nucleation so that the film is textured throughout its thickness, as far as the surface.

Without wishing to be trapped in this scientific hypothesis, the inventors think that the carbon and carbonaceous species, and possibly also the oxygen and carbonaceous compounds that comprise it, generated by the pyrolysis of the metal-organic precursor, fulfil an important role in this process and possibly block the nucleation and homogeneous growth, thus enabling the textured part easily to extend as far as the surface.

Likewise, the inventors imagine that the flow of the conditioning gas passing over the film during the heat treatment thereof acts on the kinetics of the pyrolysis of the precursors and manages the advance of the growth front of the textured part. This hypothesis would make it possible to explain why the annealing rate fulfils an important role in the pyrolysis, nucleation and crystallisation, and therefore partly determines the microstructure of the ceramic film constituting the layer of oxide.

Surprisingly, the inventors have found that, in the method according to the invention, nucleation takes place by epitaxy on the grains of the metal substrate, leading to an epitaxial layer of excellent quality, that is to say crystallised, textured on the surface and dense, which then makes it possible to deposit layers of oxide, for example REBaCuO or YBaCuO, of very good quality. The obtaining by this method of a curved epitaxial layer that is textured on the surface is surprising since any disorientation of the grains of the substrate may have repercussions on the grains that have nucleated. This is one of the problems specific to non-plane geometry; the method according to the invention solves this problem. The fact that the layer of oxide, for example the LZO layer, is textured on the surface enables the layers deposited subsequently, such as the REBaCuO, YBaCuO or silicon layer, to resume this texture when it is deposited by epitaxy; in this way a layer is obtained, for example REBaCuO, YBaCuO or silicon, with a controlled structure that has excellent physical properties, since these properties are related to the crystallographic quality of said layer and/or the interface thereof with the layer of oxide prepared according to the invention. It is therefore on non-plane (i.e. curved) substrates that the method according to the invention is particularly advantageous compared with the known methods.

The method according to the invention involves the deposition of the layer of oxide on a curved surface. It may for example be a tube. In a particular embodiment of the invention, a textured metal substrate is used that has grooves. It is possible for example to use a corrugated or ribbed substrate that has been prepared from a flat sheet by a mechanical deformation method, for example by the application of rollers. These grooves or ribs are disposed advantageously in a direction other than orthogonal in the long direction of the substrate; they do not need to be parallel with respect to one another or parallel to the long axis of the substrate. On such substrates, it is possible to deposit for example REBaCuO in the (hollow) spaces between the grooves, ribs or corrugations, which generates veins of superconducting material; thus the alternating current slopes are reduced by fractionating the section where the current flows. The method according to the invention is particularly well suited for depositing a homogeneous buffer layer of the $A_{2-x}B_{2+x}O_7$ type on such a grooved substrate (such as a corrugated or ribbed substrate), whereas the methods under vacuum on such a substrate in general lead to layers having a non-homogeneous thickness.

A corrugated, ribbed or grooved sheet can also be a substrate for photovoltaic devices.

Use of Oxide Layers According to the Invention

If the layer deposited is a layer of the LZO type with a suitable thickness (typically between 30 nm and 250 nm) it is then possible to deposit on this layer one or more superconducting layers of the REBaCuO or YBaCuO type; on the last of these superconducting layers a fine protective layer is deposited by sputtering of Ag. In a typical embodiment, the total thickness of the superconducting layers is between 200 nm and 500 nm.

The REBaCuO or YBaCuO layer is preferably deposited by the MOCVD (metal-organic chemical vapour deposition) technique, which persons skilled in the art know as such. A technique of deposition of YBaCuO by MOCVD that is suitable is described for example in the patent application WO 93/08838 and in the article published by Donet et al in J. Phys IV Pr 11 AA 319 in 2001.

It is possible to advantageously use an MOCVD technique with periodic injection of droplets as described in the aforementioned documents WO 95/02711 and U.S. Pat. No. 5,945,162, which makes it possible to synthesise thin layers of complex materials of the REBaCuO type with very good control of the stoechiometry, the growth rate and the crystalline quality of the films. The principle thereof is based on the use of an electronic-control microvalve that makes it possible to introduce very precisely controlled liquid volumes of a solution composed of organometallic precursors and a solvent. The solution is contained in a pressurised flask under inert atmosphere and connected to the injector. Microdroplets are injected sequentially into an evaporator (at a temperature of approximately 250° C.), where the solvent and precursors are vaporised. A gaseous flow transports the precursors into the reaction area, where the CVD growth takes place on a heated substrate. In this way it is possible to inject either droplets consisting of mixtures of several precursors, or successively droplets consisting of a single precursor. This technique enables layers with a complex chemical composition to be deposited.

In order to deposit evenly on a cylindrically-shaped substrate, it is possible to use for example several rows of nozzles distributed around the cylinder, or the cylindrical substrate can be turned about its long axis in front of plurality of nozzles. Sixteen nozzles can for example be used distributed over a length of 30 cm.

On top of the REBaCuO or YBaCuO layer, a metal layer is then deposited. This layer is preferably permeable to oxygen, enabling it to be diffused. Silver gives the best result. This layer can be deposited with any known technique but preference is given to deposition under conditions affording an absence of interface contaminants preventing the transfer of current between the protective layer of silver and the superconductive layer. The interface can for example be cleaned by an argon-oxygen plasma.

In one embodiment, a layer of silver with a thickness of between 250 nm and 450 nm is deposited.

The method according to the invention also makes it possible to prepare substrates for photovoltaic devices. An epitaxial LZO layer can for example be deposited on a corrugated sheet. On this LZO layer formed and crystallised as described above, crystalline silicon can be deposited by any suitable method (such as CVD or gaseous phase epitaxy). Owing to the ordered character of the LZO surface, the silicon thus deposited will, as from the first atomic layers, be a highly ordered solid having good electronic characteristics.

The method according the invention has numerous advantages. The layers of oxide are dense and have only slight porosity formed by small non-interconnected holes (probably at the grain joins), practically free from through holes (pinholes). The very low density of through holes (pinholes) gives rise to a low probability of short-circuits between the underlying metal and a metal layer deposited on top of the layer of oxide. These layers also constitute an effective barrier to diffusion between the underlying substrate and the outside (which may be another layer deposited on the layer of oxide). These layers can serve as substrates for the deposition of other layers, thin or thick. This is because the ordered crystallographic structure of the layers of oxide obtained according to the invention promotes the growth of layers with an ordered crystallographic structure and assists the quality of the interfaces between the layers, on an atomic scale.

EXAMPLES

These examples serve to illustrate embodiments of the invention, but do not limit it.

Example 1

A ceramic superconducting device was manufactured at high temperature on a layer of oxide deposited by the method according to the invention. This device has the following features:

The substrate was a tube manufactured by welding a biaxially textured Ni sheet at the edges; this tube had been functionalised with $H_2S$.

The buffer layer of metal oxide, deposited by the method according to the invention, is a layer of LZO, which typically has a thickness of between 80 nm and 210 nm.

The layer of REBaCuO or YBaCuO deposited on top of the LZO layer is advantageously a layer of YBaCuO having a thickness of between 200 nm and 500 nm, and typically around 350 nm.

The metal protective layer deposited on top of the layer of REBaCuO or YBaCuO is a layer of silver, which typically has a thickness of between 250 nm and 450 nm, and typically around 350 nm.

Such a thread of YBaCuO deposited on textured Ni thread has a temperature $T_c$ of at least 83 K, preferentially at least 85 K, and even more preferentially at least 93 K. The current density measured at 4 K is greater than 3 A per centimeter of perimeter.

Figure 1:
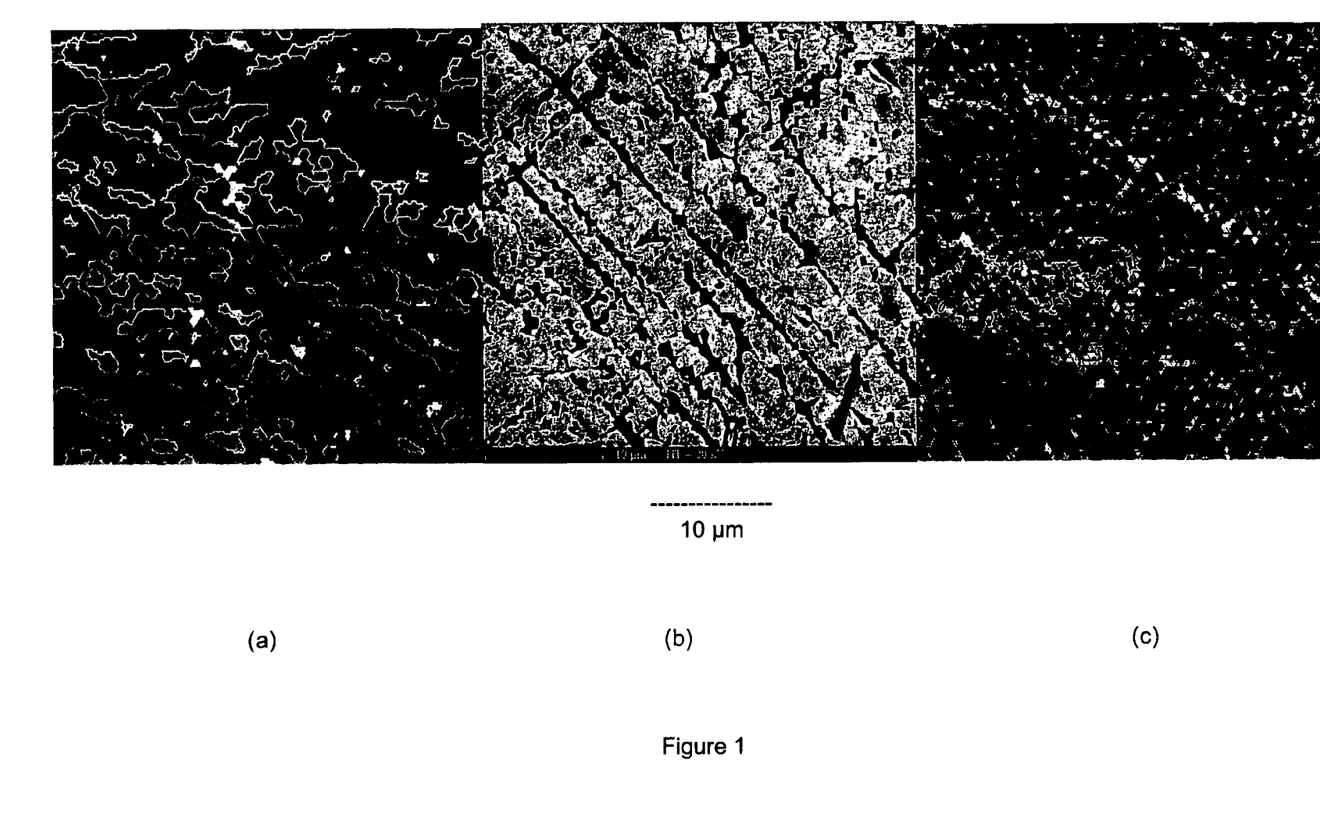
FIG. 1 shows microscopic images of the surface of a substrate coated with a layer of LZO according to the invention. The length of the bar represents 10 μm.
Figure 2:
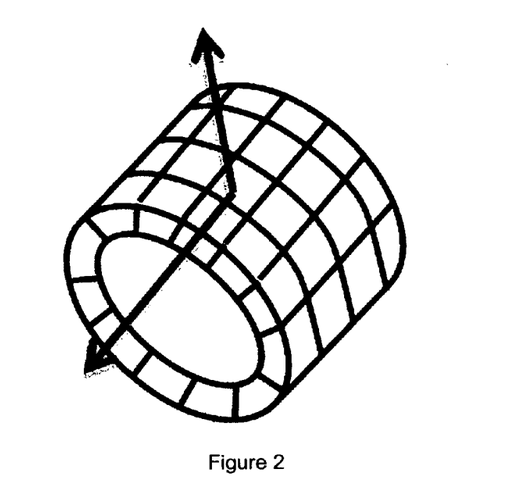
FIG. 2 shows a diagram of a textured tube used as a substrate in the method according to the invention. The texture axes are indicated: the axis parallel to the long direction of the tube, and an axis radial to the tube (i.e. perpendicular to the long direction of the tube).

FIG. 1 shows three micrographs, obtained by different techniques, of the same tube coated with a layer of LZO deposited by the method according to the invention. In this example, the layer of LZO was deposited at a thickness of 110 nm on a biaxial textured Ni-5 at. % W flat substrate, which was converted into a tube by a rolling/welding method.

FIG. 1(b) shows a micrograph obtained by scanning electron microscopy (acceleration voltage 20 kV) on a rolled/welded tube. During the drawing phase, the layer of LZO is fractured according to the Lüders bands generated by the deformation of the metal substrate. The micrograph shows the fractures of the LZO layer caused by this deformation.

FIG. 1(a) shows a micrograph obtained by scanning electron microscopy in Electron Backscattered Surface Diffraction (EBSD) mode of the same tube. This technique gives information on the relative orientations of the surface grains. The dark parts represent grains of $La_2Zr_2O_7$ with the axes [001] thereof parallel to the normal of the surface of the tube (axis r, see FIG. 4) and the axes [100] thereof parallel to the axis of the cylinder (Z). The light grey zones are turned through 45° with respect to the previous ones (direction <110>). These are areas of Ni-5 at. % W uncovered during the preparation of the tube, which appear dark on the micrograph in FIG. 1(b). They are turned through 45° with respect to the grains of $La_2Zr_2O_7$ for reasons of agreement of crystallographic mesh between these two compounds. The white regions correspond to completely disoriented grains.

FIG. 1(c) shows a micrograph obtained by scanning electron microscopy in Electron Backscattered Diffraction Mode under identical conditions to those used for FIG. 1(b), on a tube the LZO layer of which has been repaired by deposition of a second layer of LZO by the method according to the invention. It can be seen that this second deposit fills in the empty areas caused by the tube forming process, which are visible in FIGS. 1(a) and 1(b).

This example shows that the fractured LZO surface, damaged when an initially flat metal substrate is shaped, can be repaired by means of a second layer of LZO deposited according to the method of the invention.

Figure 3:
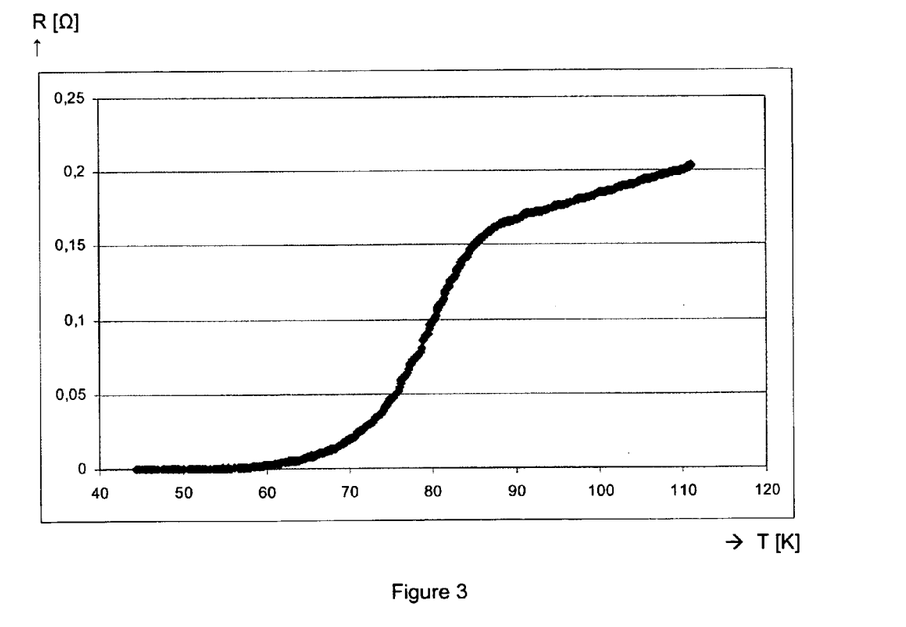
FIG. 3 shows a curve of the electrical resistance as a function of temperature for a superconductor of the YBaCuO type deposited on a buffer layer of the LZO type deposited according to the method of the invention. The horizontal axis is graduated in Kelvin, the vertical axis in Ohms.

FIG. 3 shows that a deposit of YBaCuO on such a substrate can have a resistivity of less than $0.10\Omega$ at 80 K, and a zero resistivity at around 60 K, where it becomes superconducting.

Example 2

This example describes the deposition of an epitaxiated thin layer of $La_2Zr_2O_7$ on a corrugated sheet. The substrate was a biaxially textured Ni ribbed sheet, with a thickness of 80 µm, a length of 4 cm and a width of 1 cm; its form is shown schematically in FIG. 5. This sheet was obtained from a flat sheet by pressing on two alumina rods 1 mm in diameter, disposed parallel to the length of the sample and separated by approximately 7 mm. After pressing, the shape of the rods is encrusted in the sheet, giving a corrugated form having slightly angular projections. A significant increase in the thickness of the sheet is noted, facilitating manipulation thereof.

The sheet was then dipped in a solution of a propionate of a metal with a suitable viscosity, and then extracted at the rate of 66 mm/min in order to cover it with a uniform deposit. The thickness of this deposit is determined by the flow of the liquid downwards, the critical parameters being the viscosity and the surface tension. On the surface of the sheet, the concave parts serve as drains and the thickness of the layer is smaller in these parts, as testified by the final colour of the film after crystallisation. Conversely, the projecting parts are thicker.

After drying at 60° C. for a few minutes, the sample was put to crystallise in an oven, following the treatment already described. The result was a sample covered with a bright enamel, the colour of which reflects the thickness thereof. The flat parts are sky blue, corresponding to a thickness of 80-100 nm.

The crystalline structure was observed by X-ray diffraction with a beam of 2 mm×1 mm, with a size adapted to probe the flat part. The latter is well crystallised with the expected texture (direction [001]// to the normal of the surface and the direction [100] parallel to the direction <110> of the Ni), indicating that the corrugation did not cause interference on this area.

The structural characterisation of the corrugated part can be carried out conventionally only by flattening it in a press. (On the other hand, the microdiffraction technique avoids this difficulty, which may introduce artefacts during flattening; however, this was not done in the context of the present example). Observation of the flattened sheet reveals a cubic texture of good quality (equivalent to that of the flat part) demonstrating that the corrugation created did not have any influence on the scale of the measurement, that is to say on a surface of some $2\times1$ mm$^2$. This does not exclude that distortions may exist on a micron scale on the tops of the projections, but the contribution thereof on average is indiscernible.

It is interesting to note that the flattening does not create excessive longitudinal cracking of the layer, which can be explained by its small thickness. However, short cracks perpendicular to the length of the sample were observed and were ascribable to dilatometric stresses.

The invention claimed is:

1. A method of depositing a layer of at least one metal oxide on a curved surface of a biaxially textured, face-centered cubic type metal substrate, said method comprising the steps of:

(a) depositing on the surface of the metal substrate a layer of a precursor of at least one metal oxide from an aqueous or organic solution of the at least one precursor, the solution being maintained at a temperature of between 20° C. and 40° C. during the deposition on the metal substrate and having a viscosity, measured at the temperature of the solution, of between 1 mPa s and 20 mPa s;

(b) drying said layer of oxide precursor on the metal substrate at a temperature of between 60° C. and 150° C.;
(c) heating the dried metal substrate to a temperature of between about 150° C. to about 450° C. to pyrolyse said oxide precursor and to form the metal oxide; and
(d), further heating the metal substrate to a temperature of between about 450° C. to about 1100° C. to crystallize the metal oxide, wherein the further heating is conducted under a flow of a reducing gas, said reducing gas having a flow rate greater than 0.005 cm/s.

2. The method according to claim 1, wherein the solution of the precursor of the metal oxide is a metal carboxylate solution.

3. The method according to claim 2, wherein the reducing gas is provided at a flow rate of between 0.012 cm/s and 0.1 cm/s.

4. The method according to claim 1, wherein the further heat treatment of step (d) is performed at a temperature of between 850° C. and 1000° C.

5. The method according to claim 1, wherein the heat treatment of step (d) comprises (1) increasing the temperature at a rate of between 100° C./h and 2000° C./h until the desired temperature is reached, (2) maintaining the temperature at approximately the desired temperature for a period of between 1 and 120 minutes and (3) cooling to ambient temperature at a rate of between 100° C./h and 2000° C./h.

6. The method according to claim 1, wherein the heat treatment of step (c) is carried out at least partly at a reduced pressure.

7. The method according to claim 3, wherein the reducing gas is selected from the group consisting of Argon plus $H_2$ and $N_2$ plus $H_2$.

8. The method according to claim 1, wherein said metal oxide is an oxide that crystallizes in a cubic structure, and wherein the mismatch (e) between the lattice constant of the substrate ($a_s$) and the lattice constant of the oxide ($a_{ox}$) is calculated in accordance with the formula $e=|(a_{ox}-a_s)/a_s|$ expressed as a percentage does not exceed 15%, said parameter $a_{ox}$ being taken with respect to the cubic lattice constant a of the oxide or with respect to its multiples $\sqrt{(2a)}$, 2a, or $2a\sqrt{(2a)}$.

9. The method according to claim 1, wherein said metal oxide is an oxide that crystallises in a tetragonal or orthorhombic structure, and wherein the mismatch (e) between at least two of the three lattice constants of the substrate ($a_s$) and the lattice constant of the oxide ($a_{ox}$), and calculated in accordance with the formula $e=|(a_{ox}-a_s)/a_s|$ expressed as a percentage, does not exceed 15%, said parameter $a_{ox}$ being taken with respect to the cubic lattice constant a of the oxide or with respect to its multiples $\sqrt{(2a)}$, 2a, or $2a\sqrt{(2a)}$.

10. The method according to claim 1, wherein said metal oxide is an oxide of the formula $A_{2-x}B_{2+x}O_7$ where A represents one or more metal elements of valence 3 and B represents one or more metal elements of valence 4, and x is a number between −0.1 and +0.1.

11. The method according to claim 1, wherein said metal oxide is selected from the group consisting of yttrium-stabilised zirconium oxide, $Gd_2Zr_2O_7$, $Sm_2Zr_2O_7$, $Y_2O_3$, $LaAlO_3$, $La_2Zr_2O_7$, $Gd_2O_3$, $CeO_2$, $Sm_2O_3$, $La_{0.7}Sr_{0.3}MnO_3$, $SrTiO_3$, $La_2Mo_2O_9$, $BaTiO_3$ and $LaMnO_3$.

12. The method according to claim 1, wherein a plurality of layers of metal oxide having the same or different chemical compositions are deposited on the metal substrate.

13. The method according to claim 1, further comprising after step (d) the step of depositing silicon on top of the metal oxide layer.

14. The method according to one of claim 8 or 9, further comprising after step (d) the step of depositing a superconducting oxide on top of the metal oxide layer.

15. The method according to claim 1, further comprising prior to step (a) the step of functionalization of the metal surface before deposition of the precursor layer.

16. The method according to claim 15, wherein the functionalization of the metal substrate is by one or more monolayers of sulphur.

17. The method according to claim 1, wherein the metal substrate is selected from the group consisting of a tube, a grooved sheet, a corrugated sheet or a ribbed sheet.

* * * * *